United States Patent Office 3,488,507

Patented Jan. 6, 1970

3,488,507
PHOTOVOLTAIC DETECTOR AND METHOD OF MANUFACTURE

John L. Davis, Adelphi, Md., and Marriner K. Norr, Arlington, Va., assignors to the United States of America as represented by the Secretary of the Navy No Drawing. Filed Apr. 15, 1966, Ser. No. 543,769
Int. Cl. H01l 15/02
U.S. Cl. 250—212 7 Claims

ABSTRACT OF THE DISCLOSURE

A method for producing a photovoltaic detector by epitaxially growing from a chemical solution a film of a lead salt, such as lead sulfide, onto a semiconductor substrate, such as germanium or silicon, and thereby forming a radiation sensitive heterojunction and the product thereof.

The invention described herein may be manufactured and used by or for the Government of the United States of America for governmental purposes without the payment of any royalties thereon or therefor.

This invention relates to radiation detectors and more particularly to an infrared photovoltaic detector and method of manufacture.

Infrared detectors of the photoconductive type are well known in the art. Generally, such detectors comprise a polycrystalline film which has been deposited on a glass or other substrate material. When the detectors are subjected to infrared radiation the photoconductive material responds to changing radiation intensity by changing its resistance which is measured with appropriate circuitry. While satisfactory in several applications in the past these detectors have been passive devices having slow response characteristics and have required bias supplies and complicated measuring circuitry.

Accordingly, an object of the invention is the provision of a new and improved photosensitive detector capable of operation in optical communication systems.

Another object is to provide an active radiation detector which has a low response time.

Yet another object is to provide a new and improved photovoltaic semiconductor.

Still another object is the provision of a novel method of producing epitaxial films of semiconductor material on a semiconductor substrate.

The present invention attains these and other objects by providing an infrared photovoltaic detector comprising a thin film of a lead salt semiconductor epitaxially grown on a semiconductor substrate and a method of growing the film epitaxially from a chemical solution.

The production of the photovoltaic detector begins with the preparation of the semiconductor substrates which may be for example either germanium or silicon. Crystalline orientation of the substrate material is first determined, whereupon thin slabs are cut and polished, and thereafter etched for a suitable length of time. After etched semiconductor substrates have been prepared, thin films of lead sulfide are grown on the slabs. This may be carried out by preparing a solution of water, sodium hydroxide, lead nitrate and thiourea and immersing the slab into the solution. As a result of the chemical reaction, a lead sulfide epitaxial film grows on the substrate surface forming a heterojunction between the semiconductors which is sensitive to impinging radiation.

When the formation of the heterojunction semiconductor device is concluded, electrical connection is made to the film and substrate by evaporating a gold film on the lead salt film and contacting the gold film with silver conductor paste. The substrate slab is attached both mechanically and electrically to mounting means with the silver conductive paste.

In operation, electrical connection is made to the detector output terminals and the detector is oriented so that infrared radiation is incident on the uncoated side of the substrate whereby the voltage generated between the substrate and the lead sulfide provides the detector output.

The following example is illustrative of the invention:

EXAMPLE

The following solutions are prepared:

Solution 1—5 ml. conc. HF; 10 ml. conc. $HNO_3$, and 11 ml. conc. acetic acid containing 30 mg. $I_2$.

Solution 2—300 ml. distilled water; 10 ml. 3.5 molar NaOH; 20 ml. 0.175 molar $Pb(NO_3)_2$, and 20 ml. 1.00 molar thiourea.

A germanium substrate is selected and crystalline orientation of the surface is determined by X-ray diffraction. Slabs about 1 mm. thick are cut from germanium bars with a water cooled diamond saw and then polished with a fine abrasive. The slabs are etched in solution 1 for a period of about 5 minutes. Solution 2 is prepared by initially pouring 50 ml. of the distilled water into a beaker, then adding the sodium hydroxide, lead nitrate, and the remaining 250 ml. of distilled water, in that order, with much stirring. After a clear diluted solution is obtained the chemically polished germanium slab is immersed in the solution and the thiourea is added while stirring. Stirring continues for approximately 20 seconds, and thereafter, the solution containing the substrate is allowed to sit at room temperature for 30 minutes. By this time a uniform lead sulfide epitaxial film grows on the substrate surface.

The photovoltaic device prepared in accordance with the invention comprises a thin epitaxial film of a lead salt forming a heterojunction with a semiconductor substrate. The detector, when subjected to infrared radiation, provides a rapid response voltage change which is desirable in optical communication systems. It should be apparent that although the foregoing describes one embodiment of the applicant's method and product of manufacture, the invention is not so limited. Numerous substrate semiconductor materials and thin film lead salt materials for example are contemplated. Also any well-known manner of preparing the substrate slab and connecting electrodes to the detector are within the scope of the invention.

Obviously, numerous modifications and variations of the present invention are possible in the light of the above teachings. It is therefore to be understood that within the scope of the appeaded claims the invention may be practiced otherwise than as specifically described herein.

What is claimed is:

1. The method for producing a photovoltaic detector comprising the steps of
   preparing a semiconductor substrate, and
   epitaxially growing from an aqueous chemical solution a thin semiconductor film of a lead salt on said substrate forming a heterojunction between said semiconductors, whereby said heterojunction is sensitive to impinging radiation.

2. The method of claim 1 wherein said epitaxially growing step includes the step of immersing the substrate in a lead sulfide depositing aqueous chemical solution.

3. The method for producing an infrared photovoltatic detector comprising the steps of
   preparing a semiconductor substrate,
   mixing an alkaline lead salt depositing aqueous solution, immersing said substrate in said solution, and precipitating lead salt epitaxial film semiconductor on said substrate which forms a radiation sensitive heterojunction between said semiconductors.

4. The method of claim 3 wherein the lead salt is lead sulfide and the mixing step comprises mixing together, water, sodium hydroxide, lead nitrate and thiourea to produce a lead sulfide precipitate.

5. A photovoltaic detector having a low-response time to irradiation comprising a semiconductor substrate selected from the group consisting of germanium and silicon.

an epitaxial semiconductor film of a lead salt deposited on said substrate and forming a heterojunction between said two semiconductors, and output leads connected to said thin film and said substrate, whereby an output voltage is produced on said leads in response to exposure of said detector to infrared radiation.

6. The detector of claim 5 wherein said epitaxial film is lead sulfide.

7. The method of claim 3 wherein said semiconductor substrate is selected from the group consisting of germanium and silicon.

References Cited

UNITED STATES PATENTS

| | | | |
|---|---|---|---|
| 3,082,283 | 3/1963 | Anderson | 136—89 |
| 3,121,022 | 2/1964 | Spencer | 117—215 |
| 3,121,023 | 2/1964 | Spencer et al. | 117—229 |
| 3,371,213 | 2/1968 | Adams et al. | 250—211 |

OTHER REFERENCES

Nelson: RCA Review, vol. 24, 1963, pp. 603–615.

Reynolds et al.: Physical Review, vol. 96, October 1954, pp. 533–534.

WALTER STOLWEIN, Primary Examiner

U.S. Cl. X.R.

117—201; 250—83.3, 211